United States Patent
Kahn et al.

(10) Patent No.: US 6,843,891 B2
(45) Date of Patent: Jan. 18, 2005

(54) APPARATUS FOR SPUTTER DEPOSITION

(75) Inventors: James R. Kahn, Ft. Collins, CO (US); Harold R. Kaufman, Laporte, CO (US); Viacheslav V. Zhurin, Ft. Collins, CO (US); David A. Baldwin, Annandale, VA (US); Todd L. Hylton, Great Falls, VA (US)

(73) Assignees: Kaufman & Robinson, Inc., Ft. Collins, CO (US); Veeco Instruments Inc., Plainview, NY (US)

( * ) Notice: Subject to any disclaimer, the term of this patent is extended or adjusted under 35 U.S.C. 154(b) by 365 days.

(21) Appl. No.: 09/766,069

(22) Filed: Jan. 19, 2001

(65) Prior Publication Data

US 2001/0004047 A1 Jun. 21, 2001

Related U.S. Application Data

(63) Continuation-in-part of application No. 09/471,662, filed on Dec. 23, 1999, which is a continuation-in-part of application No. 09/078,727, filed on May 14, 1998, now abandoned.
(60) Provisional application No. 60/177,894, filed on Jan. 24, 2000.

(51) Int. Cl.[7] ........................ C23C 14/00; C23C 14/32
(52) U.S. Cl. ........................ 204/192.11; 204/298.04; 204/298.11; 204/298.12
(58) Field of Search ................ 206/192.11, 298.04, 206/298.05, 298.07, 298.08, 298.11, 298.12

(56) References Cited

U.S. PATENT DOCUMENTS

| | | | | |
|---|---|---|---|---|
| 4,108,751 A | * | 8/1978 | King ................ | 204/192.11 |
| 4,376,688 A | * | 3/1983 | Ceasar et al. ......... | 204/192.11 |
| 4,693,805 A | * | 9/1987 | Quazi ................... | 204/192.22 |
| 5,423,971 A | * | 6/1995 | Arnold et al. ......... | 204/298.11 |
| 5,492,605 A | * | 2/1996 | Pinarbasi .............. | 204/192.11 |
| 5,914,018 A | * | 6/1999 | Fu et al. ............... | 204/298.12 |

OTHER PUBLICATIONS

Ion Beam Neutralization, CSC Technical Note, pp. 4, 5, and 11.*

* cited by examiner

Primary Examiner—Patrick Ryan
Assistant Examiner—Julian Mercado
(74) Attorney, Agent, or Firm—Dean P. Edmundson

(57) ABSTRACT

In one embodiment of this invention, the apparatus for sputter deposition within an evacuated volume comprises a compact gridless ion source into which an ionizable gas is introduced and from which ions leave with directed energies at or near the sputtering threshold and a sputter target near that source, biased negative relative to the surrounding vacuum enclosure, and located within the beam of ions leaving that source. Particles sputtered from the target are deposited on a deposition substrate spaced from both the ion source and the sputter target. An energetic beam of electrons can be generated by the incident ions striking the negatively biased sputter target and the deposition substrate is located either within or outside of this beam, depending on whether the net effect of bombardment by energetic electrons is beneficial or detrimental to that particular deposition process.

17 Claims, 3 Drawing Sheets

APPARATUS FOR SPUTTER DEPOSITION

CROSS-REFERENCE TO RELATED APPLICATION

This application is a continuation-in-part of our copending application Ser. No. 09/471,662, filed Dec. 23, 1999, which was a continuation-in-part of our earlier application Ser. No. 09/078,727, filed May 14, 1998, now abandoned, and the present application also claims benefit of our Provisional Application No. 60/177,894, filed Jan. 24, 2000.

FIELD OF INVENTION

This invention relates generally to the deposition of thin films, and more particularly to the deposition of thin films with controlled bombardment, or lack thereof, by energetic electrons.

This invention can find application in a variety of thin film applications such as the deposition of decorative or protective films, the deposition of conducting films for solid state electronics, the deposition of insulating or dielectric films for either solid state electronics or optical devices, or the deposition of magnetic films for recording heads or recording media.

BACKGROUND ART

Low-pressure sputter deposition is widely used for the deposition of thin films. The low background pressure of approximately one millitorr (0.13 Pascal) or less is important to minimize the collisions of sputtered particles with molecules of the background gas as they travel from the sputter target to the deposition substrate. Minimizing these collisions is important both for the cleanliness of the deposited film and avoiding degradation of the sputtered-particle energy, which is important for obtaining good adhesion and high density for the deposited film.

A closely related prior art is the sputter deposition from a grounded target that results from an energetic beam of ions being directed against that target. The most widely used ion source for such an application is the gridded ion source described in an article by Kaufman, et al., in the *AIAA Journal*, Vol. 20 (1982), beginning on page 745, incorporated herein by reference. Although it would be less likely, a gridless ion source could also be used. The end-Hall type of gridless ion source is described in U.S. Pat. No. 4,862,032—Kaufman, et al., while the closed-drift type of gridless ion source is described in U.S. Pat. No. 5,359,258—Arkhipov, et al., both of which are incorporated herein by reference. The primary advantage of such sputter deposition apparatus is the low pressure that is possible at the deposition substrate. The high pressure required for the generation of ions is confined to the inside of the ion source. The total gas flow is thereby reduced, compared to having the entire volume within the vacuum enclosure at high pressure, and moderate pumping permits the deposition substrate to be maintained at a low background pressure.

There are problems with the prior art of sputter deposition from a target using an energetic beam of ions against that target.

One problem is that the ion beam generated by the ion source must be directed only at the sputter target. Even with carefully machined and expensive ion optics grids, it is common for some energetic ions to strike other hardware besides the target and thereby introduce contamination directly into the deposited film, or through contamination sputtered onto the target, introduce contamination indirectly into the deposited film.

Another problem is the reflection of energetic neutrals from the sputter target. Energetic ions become neutralized in striking the target, and are reflected diffusely to strike the thin film being deposited on the substrate. These collisions with the substrate introduce damage sites in the deposited film.

Yet another problem is the reduced ion current capacity of ion optics for gridded ion sources at energies low enough to minimize the above problem of energetic neutral reflection. As described in the above article by Kaufman, et al., in the *AIAA Journal*, the ion current capacity of these ion optics varies approximately as the three-halves power of the voltages. Operation at low ion voltages—and energies—therefore severely restricts the ion beam current and thus the process rate.

A related problem is the large gas flow required to operate a gridded ion source when the source must be large to offset the reduction in ion current capacity due to operating the source at low voltages.

In summary, complicated and expensive apparatus is required for sputter deposition with energetic ion beams. Attempts to reduce the damage due to energetic neutrals by reducing the ion energy can result in an increase in the size of the ion source used which, in turn, can result in the increase of the gas flow and a need for larger, more expensive vacuum pumps.

A more recent technology is described in copending application Ser. No. 09/471,662 filed on Dec. 24, 1999, which is expressly incorporated herein by reference. The contamination in the deposited film is reduced in this more recent technology by using an ion source that generates a low-energy ion beam, wherein the energies of ions in this beam are sufficiently low to minimize or eliminate any sputtering due to collisions of these ions with ground-potential surfaces. The ion energy required to sputter the target is obtained, not by acceleration to a high energy in the ion source, but by biasing the target negative relative to ground potential—defined as the potential of the surrounding vacuum enclosure. This approach has a significant advantage over other ion-beam deposition processes in that it is not necessary to confine the ion beam to the sputter target to achieve a high degree of purity for the deposited films.

Because of the negative bias of the target, the secondary electrons emitted from the target are accelerated to a high energy in the plasma sheath adjacent to the sputter target. In this manner, secondary electrons emitted from the target become energetic electrons after being accelerated through the plasma sheath. Under the proper operating conditions, these energetic electrons form a directed beam away from the target. Depending on the locations of the deposition substrate, this beam of energetic electrons could strike, or not strike, the surface of the deposition substrate upon which the film was being deposited.

Energetic electrons are known to cause a variety of effects, both adverse and beneficial, on films deposited on deposition substrates, as described by Ball in *J. of Applied Physics*, Vol. 43 (1972), beginning on page 3047, and by Chapman, et al., in *J. of Applied Physics*, Vol. 45 (1974), beginning on page 2115, both of which are incorporated herein by reference. There has been, however, no recognition that specific operating parameters could control the formation, or lack of formation, of a well-defined electron beam by the acceleration of secondary electrons from a sputter target.

Electron-beam sources have been studied separately, as described by Kaufman, et al., in *J. of Vacuum Science and*

*Technology*, Vol. A3 (1985), beginning on page 1774. An electron beam in a plasma background has an upper limit on electron current beyond which the beam becomes unstable and is scattered diffusely. This maximum electron current for a well-defined beam depends both on the operating parameters and on the specific electron beam geometry.

Using stability limits from electron source technology, the stability of an electron beam formed by secondary electrons can be determined, permitting the directing of the electron beam formed by a biased target either toward or away from deposition substrates. Conversely, it is possible to operate at conditions resulting in electron beam instability, so that the energetic electron beam is scattered broadly, thereby reducing both the total energy and current density of electrons arriving at a particular substrate.

Depending on the substrate and the film being deposited upon it, the beam of energetic electrons could have beneficial or detrimental effects. Examples of the beneficial effects are: the energetic electrons can be used to enhance chemical reactions at the substrate surface, to increase nucleation of a deposited film, as well as to drive an electrically floating substrate surface to a negative potential and thereby enhance the bombardment of the substrate surface by low-energy background ions, thereby modifying film stress or producing increased film adhesion, density, or refractive index. Examples of detrimental effects are: the energetic electrons can damage sensitive film and substrate materials, either directly by collision damage or overheating, or indirectly by electrostatic charging. Knowledge of the presence and location of this energetic electron beam, which depends in turn on being able to determine its stability or instability, thus permits the use of this electron beam in deposition when the effects are beneficial and the avoidance of this electron beam when the effects are detrimental.

SUMMARY OF INVENTION

In light of the foregoing, it is an overall general object of the invention to provide an improved apparatus for sputter deposition that confines the high pressure required for ion generation to an ion source and deposits thin films in a low background pressure, in which the energetic electrons generated from a sputter target biased negative relative to ground can be used in a controlled manner.

Another object of the present invention is to provide an apparatus in which these energetic electrons are used to enhance chemical reactions at substrate surfaces.

A further object of the present invention is to provide an apparatus in which these energetic electrons are used to bias floating-potential substrate surfaces to a negative potential, thereby enhancing bombardment of substrate surfaces by low-energy background ions.

Yet another object of the present invention is to provide an apparatus in which the energetic electrons that are generated from a sputter target biased negative relative to ground are suppressed or directed away from the deposition substrates by a magnetic field located near the sputter target.

In accordance with one specific embodiment of the present invention, the apparatus for sputter deposition within an evacuated volume comprises a compact gridless ion source to generate a beam of ions into which an ionizable gas is introduced and from which ions leave with directed energies at or near the sputtering threshold, a sputter target near that source and located within the beam of ions leaving that source, a grounded shield surrounding the sputter target and defining that portion of the target which is to be exposed to sputtering, a power supply to bias the target negative relative to ground so that ions are attracted to and sputter only the target. Particles sputtered from the target are deposited on a deposition substrate separate from both the ion source and the sputter target. The deposition substrate is located either within or outside of the beam of energetic electrons generated by the negatively biased sputter target, depending on whether the net effect of bombardment by energetic electrons is beneficial or detrimental to the deposition process. Ground is defined as the potential of the surrounding vacuum enclosure, which is typically at earth ground.

DESCRIPTION OF FIGURES

Features of the present invention which are believed to be patentable are set forth with particularity in the appended claims. The organization and manner of operation of the invention, together with further objectives and advantages thereof, may be understood by reference to the following descriptions of specific embodiments thereof taken in connection with the accompanying drawings in which:

It may be noted that the aforesaid schematic cross-sectional views represent the surfaces in the plane of the section while avoiding the clutter which would result were there also a showing of the background edges and surfaces of the overall assemblies.

DESCRIPTION OF THE PREFERRED EMBODIMENT

Figure 1:
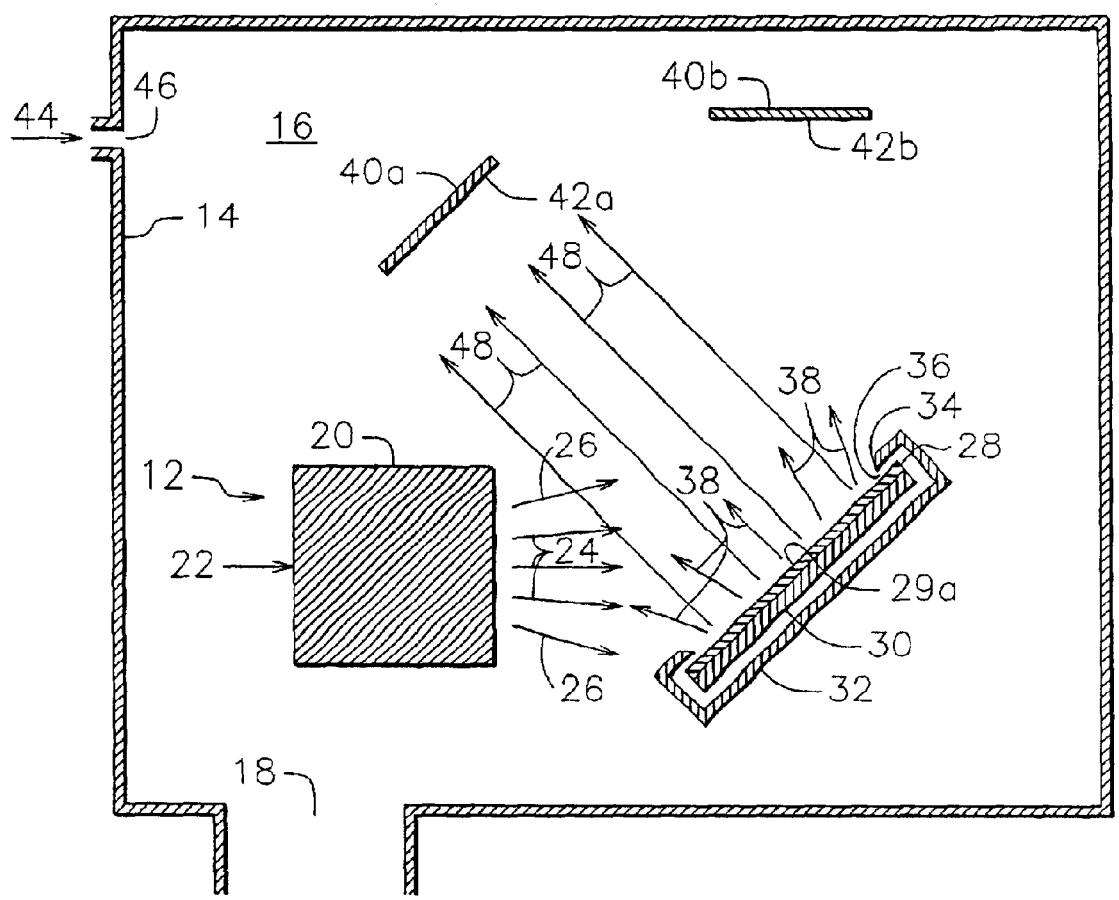
FIG. 1 is a schematic cross-sectional view of an apparatus for sputter deposition constructed in accordance with a specific embodiment of the present invention.

Referring to FIG. 1, there is shown a schematic cross-sectional view of an apparatus 12 for sputter deposition constructed in accordance with a specific embodiment of the present invention. As is customary with apparatus for sputter deposition, a grounded vacuum enclosure 14 surrounds an evacuated volume 16, which is maintained at a rarefied pressure by pumping through a port 18. In the apparatus for sputter deposition there is an ion source 20 which is shown in simplified block form because a variety of ion source designs could be used, many of which are commercially available. An ionizable gas 22 is introduced into ion source 20. Energetic ions are generated from ionizable gas 22 by ion source 20 and flow outward in an ion efflux which has a central portion 24 and a fringe 26, with all ions having energies of about 50 eV or less. Central portion 24 of the ion efflux is directed generally at sputtering target 28 and more particularly at exposed surface 29a of target 28. Target 28 is in physical contact with target support 30 and partially enclosed by grounded target enclosure 32. Target support 30 may be cooled, using a technology that is well-known to those skilled in the art. Energy is supplied to the ions that reach target 28, by biasing target support 30 and target 28, which is in electrical and physical contact with the target support, to a negative potential relative to ground. Ground is defined as the potential of the surrounding vacuum enclosure, which is typically at earth ground. Edge 34 of target enclosure 32 defines the perimeter of the exposed surface 29a of target 28. To keep the ions from the ion efflux from penetrating behind edge 34 of target enclosure 32, spacing 36 between target 28 and target enclosure 32 should be approximately equal to or less than the plasma sheath thickness at the target. Sputtered particles 38 leave exposed surface 29a in a range of directions, typically approximated with a cosine distribution. Some of sputtered particles 38 arrive at deposition substrates 40a and 40b and are deposited thereon to form thin films on the exposed surfaces 42a and 42b of said deposition substrates. A reactive gas 44 may be introduced through auxiliary port 46. Sputtered particles 38, which have energies in the range of several eV and which are sufficient to cause chemical reactions, can combine with the reactive gas at the exposed surfaces 42a and 42b of deposition substrates 40a and 40b to form deposited films that are compounds of the sputtered material and the reactive gas.

Continuing to refer to FIG. 1, an energetic electron beam 48 is emitted from exposed surface 29a of target 28 and accelerated therefrom along approximately straight-line trajectories that depart from target 28 in a normal direction from the exposed surface 29a. This electron beam can have important effects on the properties of the deposited film. To explain the presence of this electron beam, it is necessary to examine the exposed surface of the target and the region near thereto wherein the electrons originate and are accelerated.

Figure 2:
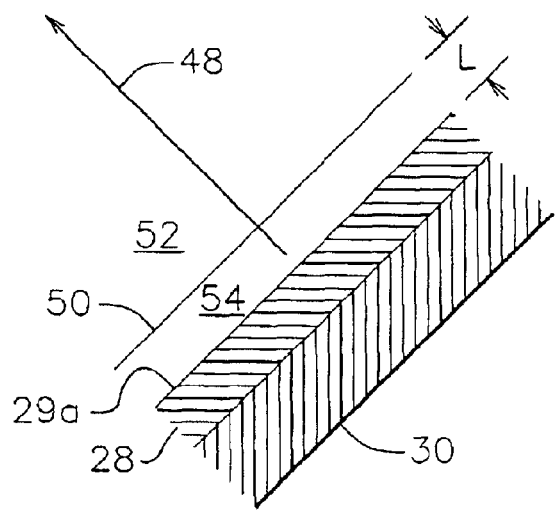
FIG. 2 is an enlarged schematic cross-sectional view of a portion of FIG. 1.

Referring now to FIG. 2, a portion of target support 30, a portion of target 28 in contact therewith, and a portion of exposed surface 29a of target 28 are shown. Also shown is boundary 50 of plasma sheath 54 spaced a sheath thickness L from the exposed surface 29a. In volume 52 outside of the plasma sheath there are both electrons and ions in approximately equal numbers (to satisfy the plasma requirement of quasineutrality). Electrons are excluded from sheath 54 between the target and boundary 50 of the plasma sheath by the negative field from the target 28. The sheath thickness L can be determined from Child's law, $$j_i = (4\varepsilon_o/9)(2e/m_i)^{1/2} V^{3/2}/L^2, \quad (1)$$

where $j_i$ is the ion current density, $\varepsilon_o$ is the permittivity of free space, $e/m_i$ is the charge-to-mass ratio of the ions, and V is the voltage across the sheath—all in SI (rationalized mks) units. For a typical value of L, one can assume argon ions at 1 mA/cm² with a negative target bias of 300 V, which give L=2.1 mm. Sheath thickness L is thus seen to be much larger than any microscopic texturing of the target surface, but also much smaller than the typical target size of at least several centimeters. The electrons that form electron beam 48 are emitted from exposed surface 29a of target 28 due to collisions of ions from ion efflux 24 thereon. Due to the relative dimensions of the exposed surface 29a, the sheath thickness L, and any microscopic roughness on the target, these secondary electrons are accelerated by the electric field within the sheath on trajectories that follow straight lines oriented normal to the local target surface 29a where they are emitted. The mean-free-path of energetic electrons is normally long compared to the target-substrate distance; for example, several meters in an argon background pressure of one millitorr (0.13 Pascal) with an electron energy of 300 eV. Because of the long mean-free-path, the electron beam 48, if stable, can maintain its direction without significant scattering over the target-substrate distance. The energy gained by the electrons being accelerated through sheath 54 will equal, in eV, the negative bias voltage relative to ground, in volts. The current of these secondary electrons is significant, typically corresponding to 10 percent or more of the ion current arriving at the target. This current may be measured with probes or estimated from secondary electron coefficients.

There is a stability limit on the current that can be carried by an electron beam in a plasma background. The ions can neutralize the space charge of the electrons, and thereby offset most steady-state space charge effects in such an electron beam. When a disturbance occurs, though, the much more massive ions cannot move rapidly enough to offset the growth of any electron-beam instability. The stability limit for an electron beam is thus approximately the same with or without the presence of charge-neutralizing ions.

The maximum electron current for a stable, well-defined beam varies as the electron energy to the 3/2 power. For a cylindrical beam of radius r flowing coaxially through a grounded enclosure of radius R, the maximum stable electron current, $I_{e,max}$, is given by Kaufman, et al., in Chapter XVI of *Operation of Broad-Beam Sources*, Commonwealth Scientific Corporation, Alexandria, Va., 1984 as $$I_{e,max} = 1.963 \pi \varepsilon_o (2e/m_e)^{1/2} V^{3/2}/[1+2ln(R/r)] \quad (2)$$

where $\varepsilon_o$ is the permittivity of free space, e is the electronic charge, $m_e$ is the electron mass, V is the voltage difference through which the electrons have been accelerated (and corresponding to the electron energy in eV). In the aforesaid article by Kaufman, et al., in the *J. of Vacuum Science and Technology*, the presence of a background plasma, which is typical of ion-beam and plasma environments, results in an effective value of R/r≈3, even though the actual wall distance corresponded to a much larger ratio. This value of R/r can be used in Equation (2) to obtain an approximate expression for maximum electron current.

$$I_{e,max} \approx 1.963 \pi \varepsilon_o (2e/m_e)^{1/2} V^{3/2}/3.2 \quad (3)$$

Equations (2) and (3) are recommended for calculations of maximum stable electron currents for circular beams formed by circular targets. Equations are given for other beam, and target, shapes by Kaufman, et al., in the aforesaid Chapter XVI in the book, *Operation of Broad-Beam Sources*.

Using the limits of Equations (2) or (3), or the equivalent equations for other beam configurations, the stability of an electron beam formed by secondary electrons can be determined, permitting the directing of the electron beam toward or away from deposition substrates. Conversely, it is possible to operate at conditions resulting in electron beam instability, so that the energetic electron beam is scattered broadly, thereby reducing the energy and current density arriving at a particular substrate.

In general, an increase in bias voltage will increase electron energy and therefore shift operation toward stability, while an increase in ion current directed toward the target will increase the generation of secondary electrons and therefore shift operation toward instability. As described in the aforesaid article by Kaufman, et al., in the *J. of Vacuum Science and Technology*, the region of intermediate stability is moderate, with operation tending to be either stable or unstable. The onset of instability is measured with a sudden decrease in electron current arriving at a probe, indicating that the beam is being scattered by instability.

In summary, depending on operating parameters understood by those skilled in the plasma-physics art, a stable and well-defined beam of energetic secondary electrons 48 may be directed out from exposed surface 29a of target 28, in addition to the much more diffuse distribution of sputtered particles 38 used to deposit films on the substrate surfaces 42a and 42b. In the embodiment of this invention shown in FIGS. 1 and 2, the directionality of such an electron beam 48 can be used to assure arrival of the energetic electrons at the deposited film (the location of substrate 40a) or the avoidance of the energetic electrons (the location of substrate 40b). Alternatively, the operating conditions may be selected so that an unstable beam of electrons is generated, resulting in a diffuse electron beam with much lower density at any one location.

The presence or absence of this electron beam can produce important effects on the properties of the deposited film. For an undesirable effect, the energetic electrons can damage sensitive film and substrate materials, either directly by collisions or indirectly by charging. For a desirable effect, the energetic electrons can be used to enhance chemical reactions at the substrate surface, as well as to drive an electrically floating substrate surface to a negative potential and thereby enhance the bombardment of the substrate surface by low-energy background ions. Knowledge of the presence and location of electron beam 48 thus permits the use of its energetic electrons in deposition when the effects are beneficial and the avoidance or substantial reduction of these energetic electrons when the effects are detrimental.

ALTERNATE EMBODIMENTS

Figure 3:
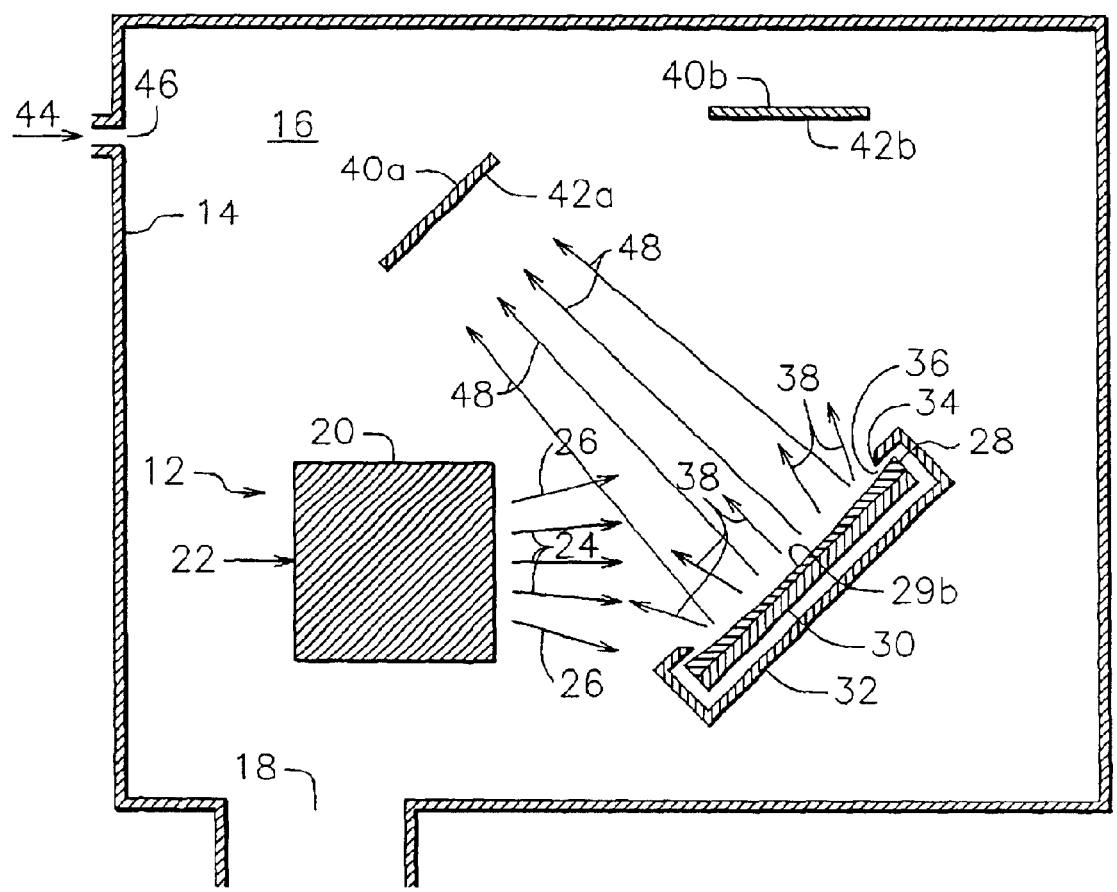
FIG. 3 is a schematic cross-sectional view of an apparatus for sputter deposition constructed in accordance with an alternate embodiment of the present invention.

The embodiment of this invention shown in FIGS. 1 and 2 shows sputter target 28 with a flat exposed surface 29a, which is the shape most often used in sputtering applications. In FIG. 3, there is shown a similar deposition apparatus wherein the only difference is that exposed surface 29b has a concave spherical shape in which the radius of curvature is large compared to the sheath thickness. Because the secondary electrons follow straight-line trajectories oriented normal to the local target surface 29b where the electrons are emitted, the concave shape of exposed surface 29b results in a focused shape for electron beam 48 with increased electron current density at substrate surface 42a.

Figure 3A:
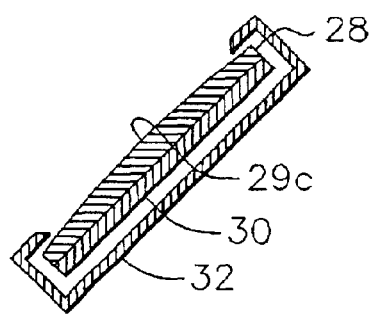
FIG. 3a is a schematic cross-sectional view of an alternate assembly of target, target support, and grounded target enclosure constructed in accordance with an another alternate embodiment of the present invention.

In FIG. 3a an alternate assembly of target 28, target support 30, and grounded target enclosure 32 is shown, which may be used in an apparatus similar to that shown in FIG. 3. The only difference from the similar assembly shown in FIG. 3 is that the exposed surface 29c of target 28 is convex, resulting in an expanding or defocused shape for the electron beam that is generated.

It should be evident to those skilled in the art that other shapes may be used for the exposed surface of the target: multiple flat planes, convex spherical surfaces, or multiple combinations of shapes, with the objective of enhancing or reducing the arrival of energetic electrons at different locations on a substrate or with different substrates.

Figure 4:
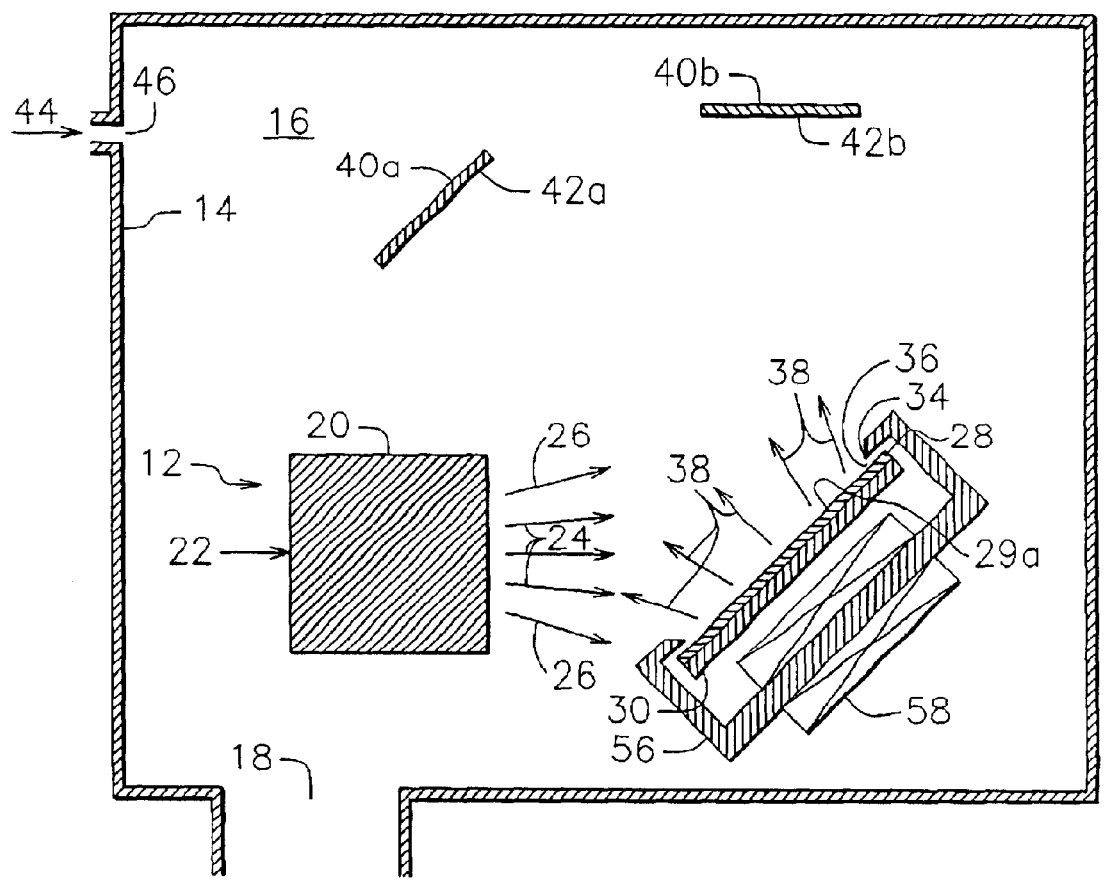
FIG. 4 is a schematic cross-sectional view of an apparatus for sputter deposition constructed in accordance with another alternate embodiment of the present invention.

Another alternate embodiment of the present invention is shown in FIG. 4, where the grounded target enclosure 56 is also a permeable path for a magnetic circuit and is magnetically energized by electromagnet winding 58.

Figure 5:
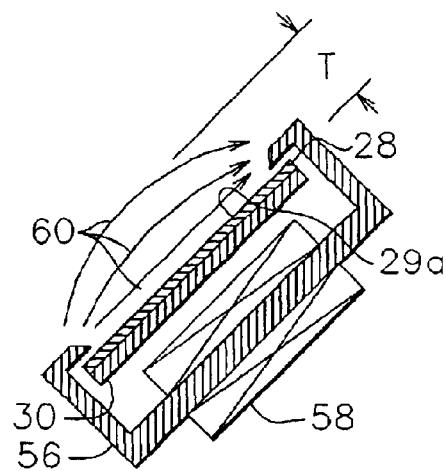
FIG. 5 is a schematic cross-sectional view of a portion of FIG. 4 showing a magnetic field region located near the target.

To avoid the excessive clutter of showing both sputtered particles 38 and the magnetic field lines in the same drawing, the magnetic field lines are omitted in FIG. 4, while the sputtered particles are omitted in FIG. 5, which otherwise duplicates the assembly of target 28, target support 30, target enclosure 56, and electromagnet winding 58 from FIG. 4.

For the magnetic field shown in FIG. 5 to contain energetic secondary electrons emitted by the exposed surface 29a of target 28, the thickness T must equal or exceed the cyclotron radius for these electrons at their maximum energy. The cyclotron radius, $r_e$, for an electron is $$r_e = m_e v_e / eB, \quad (4)$$

where $m_e$ and $v_e$ are the electron mass and velocity, e is the electronic charge, and B is the magnetic field strength, with all again in SI units. For a 300 eV electron, corresponding to a negative target bias of 300 V, the cyclotron radius is about 2 cm at a mean magnetic field strength of 30 Gauss ($30 \times 10^{-4}$ Tesla). In practice, the thickness of the magnetic field should be 50–100 percent larger than the cyclotron radius, resulting in a 3–4 cm thickness for a 30 Gauss mean field strength.

Although a magnetically permeable path energized with an electromagnet winding is indicated in FIGS. 4 and 5, other magnetic configurations should be readily evident. As one example, a permanent magnet could be used for magnetic energization. As another example, electromagnet windings without any magnetically permeable path could also be used. As a last example, multiple electromagnet windings could be used simultaneously with out-of-phase alternating currents to generate a rotating magnetic field.

Moderate magnetic field strengths over thicknesses of several centimeters can thus be used to contain the energetic secondary electrons until they collide with grounded surfaces or dissipate their energy in collisions with background particles. With such containment, a variety of substrate locations, 40a or 40b for example, may be used without exposure of the substrate or the deposited film thereon to energetic electrons.

While particular embodiments of the present invention have been shown and described, and various alternatives have been suggested, it will be obvious to those of ordinary skill in the art that changes and modifications may be made without departing from the invention in its broadest aspects. Therefore, the aim in the appended claims is to cover all such changes and modifications as fall within the true spirit and scope of that which is patentable.

What is claimed is:

1. A sputtering apparatus for use in an evacuated volume comprising:
   ion source means for ionizing an ionizable gas to produce a plasma, wherein ions leaving said ion source means are in the form of an ion efflux having an energy of about 50 eV or less;
   a sputter target, biased negative relative to ground, and having a curved target surface, wherein said curved target surface has a smooth continuous curvature in one direction, and wherein said curved target surface is disposed in the ion efflux of said ion source means, whereby particles of material are sputtered from said target;
   a deposition substrate upon which the material sputtered from said sputter target is deposited;
   and wherein said ionizable gas within said evacuated volume is at a first pressure and said ionizable gas within said ion source is at a second pressure, and wherein said first pressure is substantially less than said second pressure.

2. A sputtering apparatus in accordance with claim 1, wherein said curved target surface is concave.

3. A sputtering apparatus in accordance with claim 1, wherein said curved target surface is convex.

4. A sputtering apparatus in accordance with claim 1, further comprising a magnetic field located near said sputter target and having sufficient strength and thickness to contain secondary electrons generated by said ion efflux striking said sputter target.

5. A sputtering apparatus for use in an evacuated volume comprising:
   ion source means for ionizing an ionizable gas to produce a plasma, wherein ions leaving said ion source means are in the form of an ion efflux having an energy of about 50 eV or less;
   a sputter target, biased negative relative to ground, with said target disposed in the ion efflux of said ion source means, whereby particles of the material are sputtered from said sputter target;
   a deposition substrate upon which the material sputtered from said sputter target is deposited;
   a magnetic field located near said sputter target of sufficient strength and thickness to contain secondary electrons generated by said ion efflux striking said sputter target;
   and wherein said ionizable gas within said evacuated volume is at a first pressure and said ionizable gas within said ion source means is at a second pressure, and wherein said first pressure is substantially less than said second pressure.

6. A sputtering apparatus as defined in claim 1, 4, or 5 in which said sputter target is biased by means of a radiofrequency bias and in which the negative bias is a mean value of the radiofrequency bias.

7. A sputtering apparatus as defined in claim 1, 4, or 5 in which the bias of said sputter target is a pulsed bias and in which the negative bias is a mean value of the pulsed bias.

8. A sputtering apparatus as defined in claim 1, 4, or 5 in which said sputter target is enclosed by a target enclosure, where said target enclosure defines a portion of said sputter target that is exposed for sputtering.

9. A sputtering apparatus as defined in claim 1, 4, or 5 in which an additional reactive gas is introduced into said evacuated volume to promote the formation of compounds incorporating both said reactive gas and said material sputtered from said sputter target.

10. A sputtering apparatus as defined in claim 1, 4, or 5 in which said ion source comprises a gridless ion source.

11. A sputtering apparatus in accordance with claim 10, wherein said gridless ion source includes an electron-emitting cathode which is biased negative of ground to reduce the energy of the ions in said efflux.

12. A sputtering apparatus as defined in claim 1, 4, or 5 in which said ion source means comprises a hollow cathode.

13. A sputtering apparatus as defined in claim 1, 4, or 5 in which the operation of said ion source means includes pulsed operation.

14. A method for sputtering material from a sputter target onto a deposition substrate in an evacuated volume, the method comprising the steps of:
   (a) providing an ion source means for ionizing an ionizable gas to produce a plasma, wherein ions leaving said ion source means are in the form of an ion efflux having an energy of about 50 eV or less;
   (b) providing a sputter target;
   (c) biasing said sputter target negative relative to ground and disposing said sputter target in the ion efflux of said ion source means, whereby material is sputtered from said sputter target and whereby secondary electrons generated from collision of said ion efflux with said sputter target are accelerated away from said biased sputter target to form a beam of electrons;
   (d) positioning a deposition substrate in operative relation to said sputter target and said beam of electrons, whereby said material sputtered from said sputter target is deposited onto said substrate and said beam of electrons strikes said substrate; and
   (e) controlling the pressure of said gas within said volume such that said pressure is substantially less than the pressure of said gas within said ion source means.

15. A method for sputtering material from a sputter target onto a deposition substrate in an evacuated volume, the method comprising the steps of:
   (a) providing an ion source means for ionizing an ionizable gas to produce a plasma, wherein ions leaving said ion source means are in the form of an ion efflux having an energy of about 50 eV or less;
   (b) providing a sputter target;
   (c) biasing said sputter target negative relative to ground and disposing said sputter target in the ion efflux of said ion source means, whereby material is sputtered from said sputter target and whereby secondary electrons generated from collision of said ion efflux with said sputter target are accelerated away from said biased sputter target to form a beam of electrons;
   (d) positioning a deposition substrate in operative relation to said sputter target, outside of said beam of electrons, whereby said material sputtered from said sputter target is deposited onto said substrate; and
   e) controlling the pressure of said gas within said volume such that said pressure is substantially less than the pressure of said gas within said ion source means.

16. A method for sputtering material from a sputter target onto a deposition substrate in an evacuated volume, the method comprising the steps of:
   (a) providing an ion source means for ionizing an ionizable gas to produce a plasma, wherein ions leaving said ion source means are in the form of an ion efflux having an energy of about 50 eV or less;
   (b) providing a sputter target;
   (c) biasing said sputter target negative relative to ground and disposing said sputter target in the ion efflux of said ion source means, whereby material is sputtered from said sputter target and whereby secondary electrons generated from collision of said ion efflux with said sputter target are accelerated away from said biased sputter target to form a beam of electrons;
   (d) adjusting the magnitude of said ion efflux from said ion source means and the magnitude of said bias of said sputter target to assure unstable operation of said electron beam; and
   (e) controlling the pressure of said gas within said volume such that said pressure is substantially less than the pressure of said gas within said ion source means.

17. A method for sputtering material from a sputter target onto a deposition substrate in an evacuated volume, the method comprising the steps of:
   (a) providing an ion source means for ionizing an ionizable gas to produce a plasma, wherein ions leaving said ion source means are in the form of an ion efflux having an energy of about 50 eV or less;

(b) providing a sputter target;

(c) biasing said sputter target negative relative to ground and disposing said sputter target in the ion efflux of said ion source means, whereby material is sputtered from said sputter target and secondary electrons are generated by said ion efflux striking said sputter target;

(d) providing a magnetic field region near said sputter target for containing said secondary electrons;

(e) positioning a deposition substrate in operative relation to said sputter target whereby said material sputtered from said sputter target is deposited onto said substrate; and (f) controlling the pressure of said gas within said volume such that said pressure is substantially less than the pressure of said gas within said ion source means.

* * * * *